US006683295B2

(12) United States Patent
Cruz-Cabrera et al.

(10) Patent No.: US 6,683,295 B2
(45) Date of Patent: Jan. 27, 2004

(54) REDUCED NOISE WAVELENGTH LOCKER MODULE

(75) Inventors: Alvaro Cruz-Cabrera, Charlotte, NC (US); Thomas J. Suleski, Charlotte, NC (US); John Barnett Hammond, Charlotte, NC (US)

(73) Assignee: Digital Optics Corp., Charlotte, NC (US)

( * ) Notice: Subject to any disclaimer, the term of this patent is extended or adjusted under 35 U.S.C. 154(b) by 197 days.

(21) Appl. No.: 09/994,869

(22) Filed: Nov. 28, 2001

(65) Prior Publication Data

US 2003/0063632 A1 Apr. 3, 2003

Related U.S. Application Data

(60) Provisional application No. 60/325,543, filed on Oct. 1, 2001.

(51) Int. Cl.[7] .............................. G01B 9/02; H01J 5/16; H01J 3/13
(52) U.S. Cl. .................... 250/216; 356/519; 372/32
(58) Field of Search ................. 356/519; 250/216, 250/227.21, 227.23; 372/32

(56) References Cited

U.S. PATENT DOCUMENTS

| | | |
|---|---|---|
| 5,428,700 A | 6/1995 | Hall |
| 5,666,225 A | 9/1997 | Colbourne |
| 5,784,507 A | 7/1998 | Holm-Kennedy et al. |
| 5,798,859 A * | 8/1998 | Colbourne et al. .......... 359/247 |
| 5,825,792 A | 10/1998 | Villeneuve et al. |
| 5,828,689 A | 10/1998 | Epworth |
| 6,005,995 A | 12/1999 | Chen et al. |
| 6,061,135 A * | 5/2000 | Levitt et al. ................. 356/521 |
| 6,373,809 B1 * | 4/2002 | Rauch et al. ................ 369/121 |
| 6,385,217 B1 * | 5/2002 | Singh et al. ................... 372/20 |
| 6,452,146 B1 * | 9/2002 | Barchers .................... 250/201.9 |
| 6,560,252 B1 * | 5/2003 | Colbourne et al. ............ 372/32 |
| 6,560,253 B1 * | 5/2003 | Munks et al. .................. 372/32 |
| 6,567,437 B1 * | 5/2003 | Imaki et al. .................... 372/32 |
| 2003/0035119 A1 * | 2/2003 | Myatt et al. ................. 356/519 |
| 2003/0072010 A1 * | 4/2003 | Boye ........................... 356/520 |

FOREIGN PATENT DOCUMENTS

| | | |
|---|---|---|
| EP | 0 875 743 A1 | 2/1997 |
| EP | 0 911 621 A2 | 3/1998 |
| WO | WO97/05679 | 2/1997 |
| WO | WO99/04466 | 1/1999 |
| WO | WO99/18612 | 4/1999 |

* cited by examiner

Primary Examiner—Quyen Leung
Assistant Examiner—Phillip Nguyen
(74) Attorney, Agent, or Firm—Susan S. Morse

(57) ABSTRACT

Numerous features may be incorporated into a wavelength locker to reduce the noise inherent therein. These features may be used in any combination thereof. These features include avoiding the use of reflectors, using a diffractive splitter which outputs evanescent beams for diffractive orders greater than one, using anti-reflective coatings, using an opaque material with through holes for the light, and designing the wavelength locker to be used at a tilt.

24 Claims, 2 Drawing Sheets

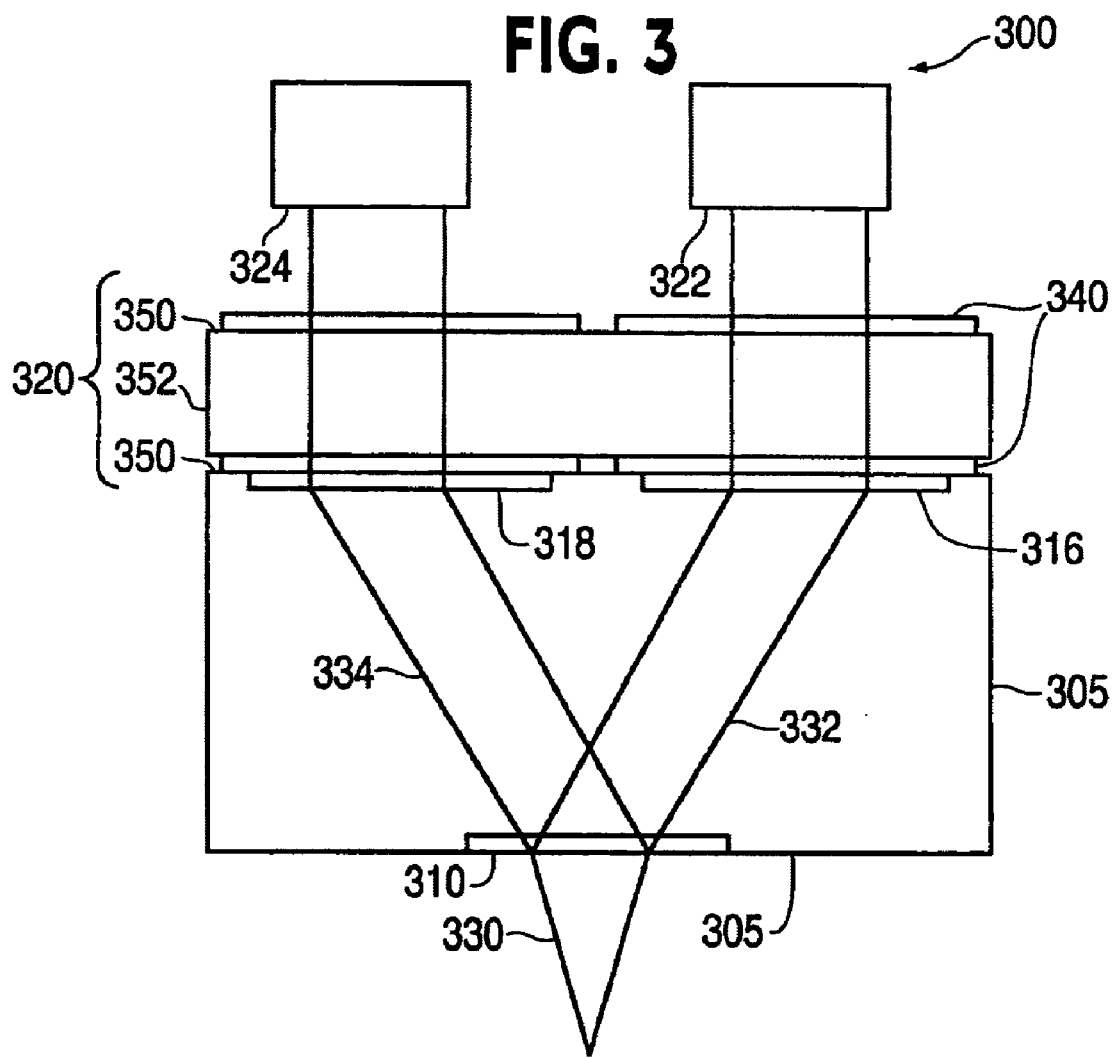

REDUCED NOISE WAVELENGTH LOCKER MODULE

CROSS-REFERENCE TO RELATED APPLICATIONS

The present application claims priority under 35 U.S.C. §119(e) to U.S. Provisional Application Serial No. 60/325,543 entitled "Reduced Noise Wavelength Locker Module" filed on Oct. 1, 2001, the entire contents of which are hereby incorporated by for all purposes.

FIELD OF THE INVENTION

The present invention is directed to a wavelength locker/monitor, more particularly to a wavelength locker/monitor which reduces noise.

BACKGROUND OF THE INVENTION

A wavelength locker disclosed in co-pending, commonly assigned U.S. patent application Ser. No. 09/543,760 entitled "An Etalon, a Wavelength Monitor/locker Using The Etalon and Associated Methods" filed on Apr. 5, 2000, the entire contents of which are hereby incorporated by reference for all purposes, is shown in FIG. 1. A wavelength locker module 1100 includes an optics block 105, a pair of photodetectors 122, 124 and a mount 126 for housing the photodetectors 122, 124. The optics block 105 includes a splitter diffractive element 110, two reflectors 112, 114, and two correcting diffractive optical elements 116, 118. An etalon 120 may be mounted to the optics block 105 or otherwise positioned between the optics block and one of the photodetectors 122, 124.

The splitter diffractive element 110 receives an input beam 130 and splits two beams 132, 134 off of the input beam 130. A through beam 136 continues on in the optical system if the wavelength locker 100 is used to monitor light output from a front facet of a light source. Typically, the split beams 132, 134 are the +/−1 diffractive order beams. As shown in this particular configuration, the beam 132 serves as a reference beam and the beam 134 serves as the filter beam. The reflectors 112, 114 reflect the reference beam 132 and the filter beam 134, respectively, to the corrector diffractive elements 116, 118, respectively. The reference beam 132 travels to the reference photodetector 122. The filter beam 134 travels through the etalon 120 to the filter photodetector 124.

The use of the reflectors to fold the reference and filter beams allows the separation of reference and filtered beams to be large enough that the detectors may be packaged in the optical system without having to manufacture diffractives with extremely small feature size and more than two phase levels. However, these reflectors also give rise to noise in the reference and filter signals, e.g., the reflected signal of the etalon in the reference side and the etalon effect due to the parallel surfaces of the optics block 105. Further, the reflectors potentially clip the through beam 136, reducing the power therein and adding noise.

SUMMARY OF THE INVENTION

The present invention is therefore directed to a wavelength monitor/locker which substantially overcomes one or more of the problems due to the limitations and disadvantages of the related art.

It is an object of the present invention to provide various features which aid in reducing noise in a wavelength locker. These features may be used in any combination in a wavelength locker. These features include avoiding the use of reflectors, using a diffractive splitter which outputs evanescent beams for diffractive orders greater than one, using anti-reflective coatings, using an opaque material with through holes for the light, and designing the wavelength locker to be used at a tilt.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which:

FIG. 3 is a schematic side view of another embodiment of the integrated wavelength locker of the present invention.

DETAILED DESCRIPTION OF EMBODIMENTS

In the following description, for purposes of explanation and not limitation, specific details are set forth in order to provide a thorough understanding of the present invention. However, it will be apparent to one skilled in the art that the present invention may be practiced in other embodiments that depart from these specific details. In other instances, detailed descriptions of well-known devices and methods are omitted so as not to obscure the description of the present invention with unnecessary details.

Figure 1:
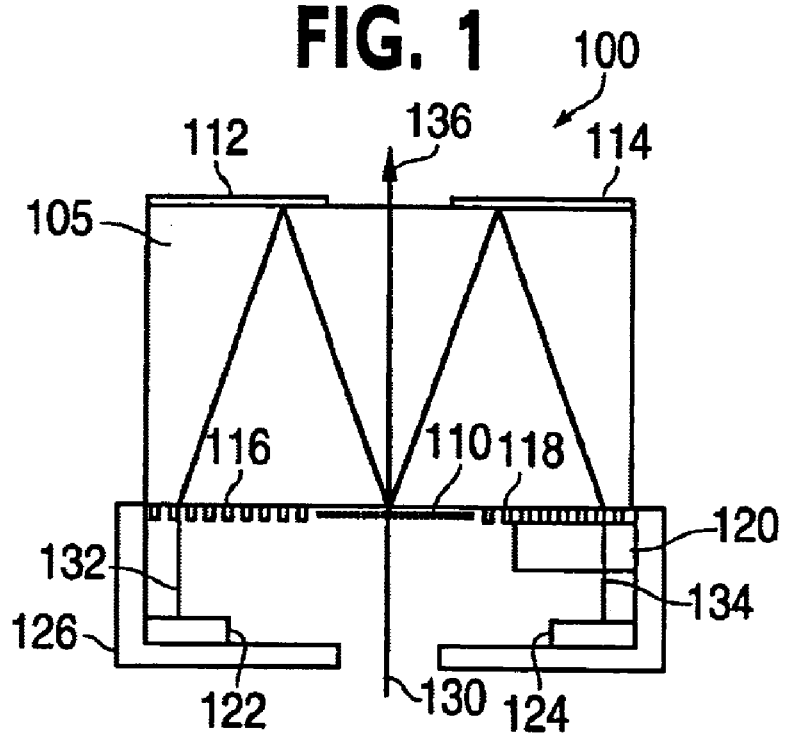
FIG. 1 is a schematic side view of an embodiment of an integrated wavelength locker.
Figure 2:
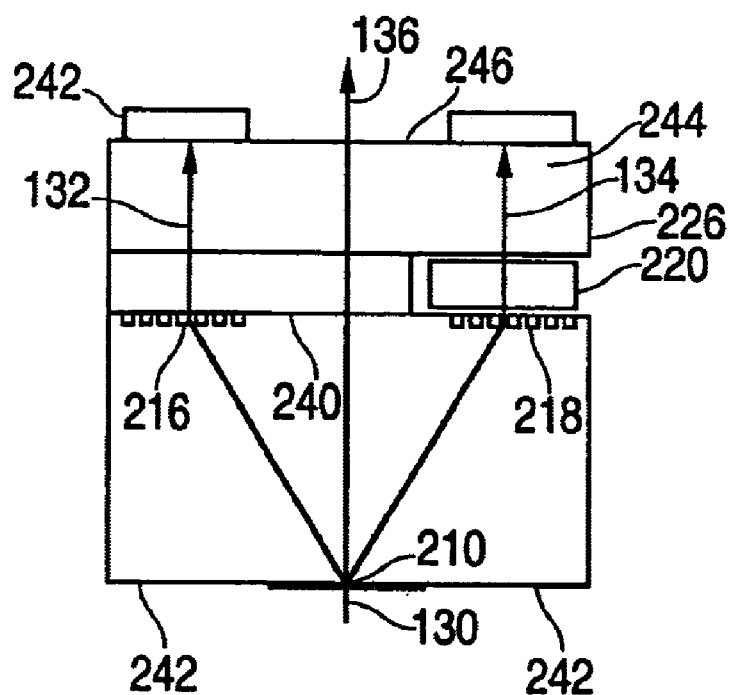
FIG. 2 is a schematic side view of an embodiment of an integrated wavelength locker of the present invention.

A wavelength locker configuration incorporating several features for noise reduction is shown in FIG. 2. Here, a "Y" wavelength locker 200, i.e., the light path of the input, filter and reference beams forms a "Y" is shown. The "Y" wavelength locker 200 does not use reflectors, thereby eliminating one source of noise present in the configuration of FIG. 1. The "Y" wavelength locker 200 includes an optics block 205, a pair of photodetectors 222, 224 and a mount 226 for housing the photodetectors. The optics block 205 includes a splitter diffractive element 210 and two correcting diffractive optical elements 216, 218. An etalon 220 maybe mounted to the optics block 205 or otherwise positioned between the optics block 205 and one of the photodetectors 222, 224.

The splitter diffractive element 210 receives an input beam 130 and splits two beams 132, 134 off of the input beam 130. The through beam 136 continues on in the optical system if the wavelength locker 200 is used to monitor light output from a front facet of a light source. Typically, the split beams 132, 134 are the +/−1 diffractive order beams. As shown in this particular configuration, the beam 132 serves as a reference beam and the beam 134 serves as the filter beam. The reference beam 132 and the filter beam 134 propagate to the corrector diffractive elements 216, 218, respectively. The reference beam 132 travels to the reference photodetector 222. The filter beam 134 travels through the etalon 220 to the filter photodetector 224.

The splitter diffractive element 210 may be designed to be binary with periods small enough that the higher orders than +1 and −1 are evanescent. The corrector diffractives 216, 218 are located on the other face of the optics block 205 and may be manufactured using any known technique. The corrector diffractives are to maintain a normal or quasi-normal beam with respect to the etalon and to limit the size of the module 200.

An anti-reflective (AR) structure 240 may be provided in the path of the through beam 136 to alleviate reflection from the output surface of the wavelength locker 200. The AR structure 240 may have a period smaller than the working wavelengths. The AR structure 240 may be formed using a patterning technique to avoid the location of the corrector diffractives 216, 218. Then, the AR structure 240 is protected during the formation of the diffractive corrector elements.

Further, the mount 226 supporting the photodetectors 222, 224 may be a ceramic chip carrier with the photodetectors 216, 218 flip chip mounted thereto. The mount 226 may be provided with through holes 242, 244, 246 for the through beam 136 and the reference and filter beams 132, 134, respectively. These through holes 242, 244, 246 diminish the risk of stray light hitting the photodetectors 222, 224. Further, the use of flip chip bonding reduces the height of the module 200, as well as facilitating the use of the through holes.

Additionally, anti-reflective features 242 may be provided on the optics block 205 on the same surface as the splitter 210 to further reduce an etalon effect on the reference signal 134. Since the splitter 210 is a high frequency grating, thus having very small features, using an AR coating on this surface will adversely affect the grating. Therefore, the anti-reflective feature may be a binary diffractive at 90 degrees from the splitter so that light is scattered out of the plane. Further, by varying the etch depth and/or the duty cycle of the grating for the splitter 210 in a known fashion, the splitter 210 may be designed to further act as an AR feature.

Additionally or alternatively, to reduce the etalon effect from the optics block 205 on the reference signal 132 and/or the filter signal 134, the wavelength locker 200 may be designed to be used at a tilt. The corrector diffractive elements 216, 218 are designed using periods that are slightly smaller or larger than for normal incidence such that the actual etalon has a normal beam. The corrector diffractive element 218 may also correct for an etalon with a free spectral range smaller than a desired value by more than 0.1 GHz by adjusting the incident angle of the beam on the etalon 220. The tilt will further help reduce back reflection problems. The tilt may be introduced such that the angle for the reference beam 132 from the splitter 210 becomes larger with respect to normal, i.e., the reference beam 132 is shallower on the diffractive 216, so that more power is provided to the filter beam 134.

The embodiments shown in FIGS. 1 and 2 have assumed that the wavelength locker is to monitor a beam from a front facet of a light source, i.e., an application beam is to pass therethrough. In FIG. 3, a wavelength locker 300 for use with light output from a back facet of a light source, or if no through beam is to be provided, is shown. The wavelength locker 300 includes an optics block 305 and a pair of photodetectors 322, 324. The optics block 305 includes a splitter diffractive element 310 and two correcting diffractive optical elements 316, 318. Since no beam is to pass through the wavelength locker 300, an etalon 320 may be formed using two etalon coatings 350 provided on a substrate 352 mounted to the optics block 305 or otherwise positioned between the optics block 305 and one of the photodetectors 322, 324. The path to the reference detector 322 may include AR coatings 340 to help reduce noise. The mount for the photodetectors 322, 324 may be either configuration previously shown.

Again, the splitter diffractive element 310 receives an input beam 330 and splits two beams 332, 334 off of the input beam 330. Typically, the split beams 332, 334 are the +/−1 diffractive order beams. The zero order beam is very small relative to the diffracted beams. As shown in FIG. 3, the light to be monitored is diverging, so the splitter diffractive element 310 may also collimate the input beam 330. As shown in this particular configuration, the beam 332 serves as a reference beam and the beam 334 serves as the filter beam. The reference beam 332 and the filter beam 334 propagate to the corrector diffractive elements 316, 318, respectively. The reference beam 332 travels to the reference photodetector 322. The filter beam 334 travels through the etalon 320 to the filter photodetector 324. The detectors 322, 324 may be mounted in either configuration shown in FIGS. 1 and 2.

While specific embodiments for reducing noise in a wavelength locker have been illustrated, it is to be understood that many of the elements used for reducing noise may be used in any of the above configurations. For example, while the reflectors cannot be eliminated from the configuration in FIG. 1, the splitter 110 could be designed to be evanescent for orders higher than +/−1, an AR coating could be provided at the output of the through beam 136, and/or the photodetectors could be mounted on a ceramic carrier having through holes for each beam. Further, the configuration in FIG. 1 could be tilted to reduce noise, although the reflectors could still provide a path for unwanted signals.

It will be obvious that the invention may be varied in a plurality of ways, such as the use of different noise reducing features in various combinations. Such variations are not to be regarded as a departure from the scope of the invention.

What is claimed is:

1. A wavelength detector comprising:
   a splitter on an optics block dividing an input beam into a first portion and a second portion;
   a first detector and a second detector;
   corrector optics for the first and second portions, the correctors optics being on an opposite side of the optics block from the splitter, the corrector optics directing the first and second portions substantially orthogonally onto the first and second detectors, respectively; and
   a wavelength selective element in an optical path of one of the first and second portions before a respective detector.

2. The wavelength detector of claim 1, wherein the splitter is a diffractive splitter outputting evanescent beams for diffractive orders greater than one.

3. The wavelength detector of claim 1, further comprising a substrate extending in the optical path of both the first and second portions.

4. The wavelength detector of claim 1, wherein the wavelength selective element is an etalon.

5. The wavelength detector of claim 1, wherein the wavelength selective element is an etalon including reflective coatings on either side of the substrate in the optical path of one of the first and second portions.

6. The wavelength detector of claim 5, further comprising anti-reflective coatings on the substrate outside of the etalon.

7. The wavelength detector of claim 5, wherein the substrate is co-extensive with the optics block.

8. The wavelength detector of claim 1, further comprising an opaque material between the corrector optics and the detectors, the opaque material having through holes therein for the first and second portions.

9. The wavelength detector of claim 8, wherein the opaque material further includes a through hole for a zero order beam.

10. The wavelength detector of claim 8, wherein the detectors are mounted on the opaque material.

11. The wavelength detector of claim 10, wherein the detectors are flip-chip mounted to the opaque material.

12. The wavelength detector of claim 8, wherein the opaque material is a ceramic chip carrier.

13. The wavelength detector of claim 1, wherein the splitter serves as an anti-reflective coating.

14. A wavelength detector comprising:

a splitter on an optics block dividing an input beam into a first portion and a second portion;

a first detector and a second detector;

corrector optics for the first and second portions, the corrector optics directing the first and second portions substantially orthogonally onto the first and second detectors, respectively;

a wavelength selective element in an optical path of one of the first and second portions before a respective detector; and an opaque material between the corrector optics and the detectors, the opaque material having through holes therein for the first and second portions.

15. The wavelength detector of claim 14, wherein the opaque material further comprises a through hole for the input beam.

16. The wavelength detector of claim 14, wherein the opaque material further comprises a through hole for a zero order beam.

17. The wavelength detector of claim 14, wherein the detectors are mounted on the opaque material.

18. The wavelength detector of claim 17, wherein the detectors are flip-chip mounted to the opaque material.

19. The wavelength detector of claim 14, wherein the opaque material is a ceramic chip carrier.

20. The wavelength detector of claim 14, wherein the wavelength selective element is an etalon.

21. A wavelength detector comprising:

a diffractive splitter outputting evanescent beams for diffractive orders greater than one, the splitter dividing an input beam into a first portion and a second portion;

a first detector and a second detector;

corrector optics for the first and second portions, the corrector optics directing the first and second portions substantially orthogonally onto the first and second detectors, respectively; and a wavelength selective element in an optical path of one of the first and second portions before a respective detector.

22. A wavelength detector comprising:

a splitter on an optics block dividing an input beam into a first portion and a second portion;

a first detector and a second detector;

corrector optics for the first and second portions, the corrector optics directing the first and second portions substantially orthogonally onto the first and second detectors, respectively;

an etalon in an optical path of one of the first and second portions before a respective detector; and a substrate extending in the optical path of both the first and second portions, the etalon including reflective coatings on either side of the substrate in the optical path of one of the first and second portions, and anti-reflective coatings on the substrate outside of the etalon.

23. An optical subsystem comprising:

a diffractive splitter on a substrate, the diffractive splitter receiving light at a non-orthogonal angle, the diffractive splitter outputting plus and minus first order beams having different angles; and corrective optical elements, corresponding to said plus and minus first order beams for directing said plus and minus first order beams substantially orthogonally onto corresponding detectors.

24. The optical subsystem of claim 23, wherein the diffractive splitter further provides a third beam serving as an application beam.

\* \* \* \* \*